US011451224B2

(12) United States Patent
Tao

(10) Patent No.: US 11,451,224 B2
(45) Date of Patent: Sep. 20, 2022

(54) SINGLE-POLE DOUBLE-THROW SWITCH CIRCUIT WITH TYPE-C INTERFACE, ANALOG SWITCH CHIP, AND ELECTRONIC DEVICE

(71) Applicant: SHANGHAI YAOHUO MICROELECTRONICS Co., Ltd., Shanghai (CN)

(72) Inventor: Hongxia Tao, Shanghai (CN)

(73) Assignee: SHANGHAI YAOHUO MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/280,907

(22) PCT Filed: Aug. 10, 2020

(86) PCT No.: PCT/CN2020/108147
§ 371 (c)(1),
(2) Date: Mar. 28, 2021

(87) PCT Pub. No.: WO2021/036772
PCT Pub. Date: Mar. 4, 2021

(65) Prior Publication Data
US 2022/0182053 A1   Jun. 9, 2022

(30) Foreign Application Priority Data
Aug. 28, 2019 (CN) .......................... 201910802895.3

(51) Int. Cl.
*H03K 17/567* (2006.01)
*G06F 17/00* (2019.01)
*H03K 17/51* (2006.01)

(52) U.S. Cl.
CPC .......... *H03K 17/567* (2013.01); *G06F 17/00* (2013.01); *H03K 2017/515* (2013.01)

(58) Field of Classification Search
None
See application file for complete search history.

(56) References Cited

U.S. PATENT DOCUMENTS 6,097,113 A * 8/2000 Teraoka ............. H03K 19/0013
327/544

FOREIGN PATENT DOCUMENTS

| CN | 106294244 A | 1/2017 |
| CN | 206149480 U | 5/2017 |

(Continued)

OTHER PUBLICATIONS

International Search Report of the corresponding PCT Application No. PCT/CN2020/108147 dated Nov. 12, 2020.

*Primary Examiner* — Daniel C Puentes
(74) *Attorney, Agent, or Firm* — NZ Carr Law Office PLLC

(57) ABSTRACT

The present invention provides a single-pole double-throw switch circuit with a Type-C interface, an analog switch chip and an electronic device, which can generate a reverse bias voltage across a first diode, so that a capacitance value of a PN junction can be significantly reduced after the reverse bias voltage is applied to the PN junction. Further, a ground capacitance corresponding to a COM point when the first diode is turned off can be effectively reduced, avoiding the reduction of a bandwidth of a digital path due to excessive capacitance. It can be seen that the present invention can realize a large size of a first field effect transistor and a high bandwidth of the digital path simultaneously, thereby facilitating the simultaneous improvement of the THD performance of an analog audio path and the bandwidth of the digital path, and avoiding conflicts between the two.

20 Claims, 4 Drawing Sheets

(56) References Cited

FOREIGN PATENT DOCUMENTS

| | | | | |
|---|---|---|---|---|
| CN | 106874233 | A | 6/2017 | |
| CN | 110113038 | A | 8/2019 | |
| CN | 110365323 | A | 10/2019 | |
| EP | 3657817 | A1 * | 5/2020 | ........... G06F 13/387 |
| JP | 2001326502 | A | 11/2001 | |
| WO | WO-2019015392 | A1 * | 1/2019 | ........... G06F 13/387 |

* cited by examiner

SINGLE-POLE DOUBLE-THROW SWITCH CIRCUIT WITH TYPE-C INTERFACE, ANALOG SWITCH CHIP, AND ELECTRONIC DEVICE

TECHNICAL FIELD

The present invention relates to an electronic device, in particular, to a single-pole double-throw switch circuit with a Type-C interface, an analog switch chip and an electronic device.

BACKGROUND

The electronic products supporting TypeC interface often use a dedicated analog switch chip containing two single-pole double-throw switch circuits, wherein the D+ pin and D− pin in the TypeC interface can output high-speed USB digital signals and analog audio signals in a time-sharing manner.

In order to be suitable for time-sharing output of high-speed USB digital signals and analog audio signals, the circuit can be provided with a digital path for outputting USB digital signals and an analog audio path for outputting analog audio signals.

In the prior art, the transmission of high-speed USB digital signals in the digital path needs to support high bandwidth, while the transmission of analog audio signals in the analog audio path needs to support extremely-small total harmonic distortion. These two requirements will conflict with each other in the analog audio path, for example: in order to ensure good THD performance of the audio of the analog audio path, it is necessary to increase the size of the field effect transistor constituting the analog audio path as much as possible; however, if the size of the field effect transistor in the analog audio path is increased, the turn-off capacitance when the analog audio path is turned off will increase, while excessive turn-off capacitance when the analog audio path is turned off will cause the bandwidth of the digital path to decrease.

It can be seen that in the prior art, the THD performance of the audio of the analog audio path and the bandwidth of the digital path cannot be considered simultaneously.

SUMMARY

The present invention provides a single-pole double-throw switch circuit with a Type-C interface, an analog switch chip and an electronic device, so as to solve the problem of being difficult to consider the THD performance of the audio of the analog audio path and the bandwidth of the digital path simultaneously.

According to a first aspect of the present invention, a single-pole double-throw switch circuit with a Type-C interface is provided, including a digital path and an analog audio path that may be turned on in a time-sharing manner and connected to the same COM port, two pins of the COM port are connected to a D+ pin and a D− pin of the Type-C interface respectively; the analog audio path is provided with a first field effect transistor, and a PN junction between a substrate and a source of the first field effect transistor may form a first diode, wherein the substrate of the first field effect transistor is a first terminal of the first diode, and the source of the first field effect transistor is a second terminal of the first diode; the circuit further includes a reverse bias voltage module; the reverse bias voltage module is connected between the first diode for generating a reverse bias voltage across the first diode.

Optionally, the reverse bias voltage module includes an isolation field effect transistor, a voltage adjustment unit, and an impedance unit capable of generating a voltage drop when a current flows; a drain of the isolation field effect transistor is connected to other circuits, and a source of the isolation field effect transistor is connected to one terminal of the impedance unit; a gate of the isolation field effect transistor and a second terminal of the first diode are commonly connected to a first node; the other terminal of the impedance unit and the first terminal of the first diode are commonly connected to a second node; when the reverse bias voltage is generated, a potential of the first node is higher than a potential of the second node, and a voltage between the first node and the second node is the reverse bias voltage; the voltage adjustment unit is connected to the second node for adjusting the reverse bias voltage, so that the reverse bias voltage is within a required value range or is within a required value.

Optionally, the voltage adjustment unit includes a current determination device connected to the second node; the current determination device is configured to determine a current magnitude of the second node, so that the reverse bias voltage may be within a required value range or may be within a required value.

Optionally, the current determination device includes a current source connected to the second node.

Optionally, the impedance unit includes a resistor connected in series between the source of the isolation field effect transistor and the second node.

Optionally, the second node is further connected to a third node, a potential of the third node is lower than the potential of the second node, and the voltage adjustment unit comprises a variable voltage source provided between the second node and the third node; the variable voltage source is configured to determine a voltage between the third node and the second node, so that the reverse bias voltage may be within a required value range or may be within a required value.

Optionally, the value range of the reverse bias voltage is 4V to 5V.

Optionally, the digital path is provided with a second field effect transistor, and the PN junction between the substrate and the source of the second field effect transistor may form a second diode.

According to a second aspect of the present invention, an analog switch chip is provided, including two circuits of the single-pole double-throw switch circuit with a Type-C interface involved in the first aspect and the optional solutions thereof.

The present invention provides a single-pole double-throw switch circuit with a Type-C interface, an analog switch chip and an electronic device, which can generate a reverse bias voltage across a first diode, so that a capacitance value of a PN junction can be significantly reduced after the reverse bias voltage is applied to the PN junction. Further, a ground capacitance corresponding to a COM point when the first diode is turned off can be effectively reduced, thereby avoiding the reduction of a bandwidth of a digital path due to excessive capacitance. Based on the present invention, it can be seen that the present invention can realize a large size of a first field effect transistor and a high bandwidth of the digital path simultaneously, thereby facilitating the simultaneous improvement of the THD performance of an analog audio path and the bandwidth of the digital path, and avoiding conflicts between the two.

BRIEF DESCRIPTION OF THE DRAWINGS

To describe the technical solutions in the embodiments of the present invention or in the prior art more clearly, accompanying drawings required to describe the embodiments or the prior art are briefly described below. It is obvious that the accompanying drawings described below are only some embodiments of the present invention. It is apparent to those of ordinary skill in the art that other drawings may be further obtained based on the accompanying drawings without inventive effort.

DESCRIPTION OF REFERENCE NUMERALS

1, N1—First field effect transistor;
2, N2—Second field effect transistor;
3, D1—First diode;
4—Reverse bias voltage module;
41, N3—Isolation field effect transistor;
42—Impedance unit;
R—Resistor;
43—Voltage adjustment unit;
431—Current determination device;
4311—Current source;
5—COM port;
6—First node;
7—Second node;
8—Third node;

DETAILED DESCRIPTION OF THE EMBODIMENTS

Clear and intact description will be made on technical schemes in the embodiments of the present invention below in combination with drawings in the embodiments of the present invention. Obviously, the described embodiments are merely a part of embodiments of the present invention and are not all the embodiments. Based on the embodiments of the present invention, all the other embodiments obtained by those of ordinary skill in the art without inventive effort are within the scope of the present invention.

Terms "first", "second", "third", "fourth", and the like (if any) in the specification and claims of the present invention and the foregoing accompanying drawings are used to distinguish similar objects, but do not need to be used for describing a specific sequence or an order. It should be understood that data used in this way can be interchanged under appropriate circumstances, so that the embodiments of the present invention described herein can be implemented in an order other than those illustrated or described herein. In addition, terms "including", "having", and any variations thereof are intended to cover non-exclusive inclusions, for example, processes, methods, systems, products, or devices that contain a series of steps or units need not be limited to those clearly listed steps or units, but may include other steps or units not explicitly listed or inherent to these processes, methods, products, or devices.

The technical solutions of the present invention are described in detail below with reference to the specific embodiments. The following several embodiments may be combined with each other, and a same or similar concept or process may not be described again in some embodiments.

Figure 1:
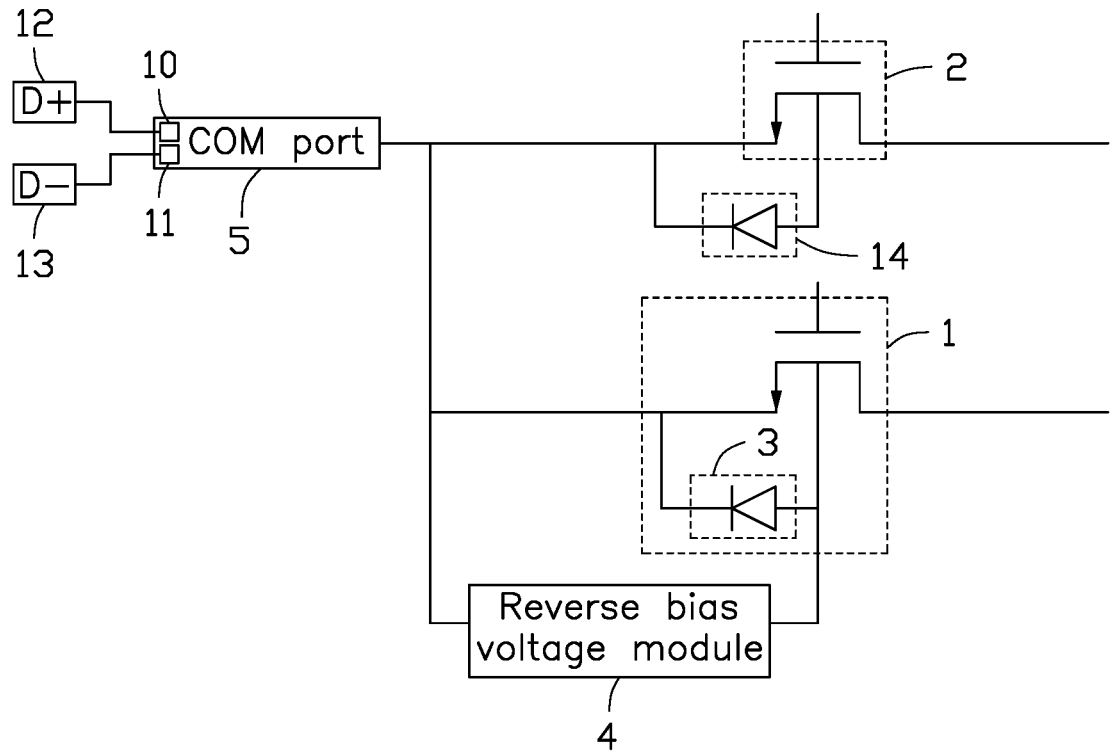
FIG. 1 is a structural schematic diagram 1 of a single-pole double-throw switch circuit with a Type-C interface in an embodiment of the present invention.

FIG. 1 is a structural schematic diagram 1 of a single-pole double-throw switch circuit with a Type-C interface in an embodiment of the present invention.

With reference to FIG. 1, a single-pole double-throw switch circuit with a Type-C interface includes a digital path and an analog audio path that may be turned on in a time-sharing manner and connected to the same COM port 5, two pins 10, 11 of the COM port 5 are connected to a D+ pin 12 and a D− pin 13 of the Type-C interface respectively.

The analog audio path may be understood as a path used to transmit analog audio signals, and the path is formed by various devices and connecting circuits.

In the present embodiment, the analog audio path is provided with a first field effect transistor 1, and a PN junction between a substrate and a source of the first field effect transistor 1 may form a first diode 3, wherein the substrate of the first field effect transistor 1 is a first terminal of the first diode 3, and the source of the first field effect transistor 1 is a second terminal of the first diode 3.

Specifically, for example, in the structure of the field effect transistor, two N regions may be formed on a P-type silicon wafer substrate as source and drain regions respectively connected to corresponding electrodes, wherein a PN junction exists between the substrate and the single N region, and the PN junction may form the first diode mentioned above and the second diode mentioned later.

Further, any path for transmitting analog audio signals with the first field effect transistor 1 may be understood as the analog audio path involved in the present embodiment.

The digital path may be understood as a path used to transmit high-speed USB digital signals, and the path is formed by various devices and connecting circuits.

In an embodiment, the digital path is provided with a second field effect transistor 2, and further the PN junction between the substrate and the source of the second field effect transistor 2 may form a second diode 14. The relationship between the second field effect transistor 2 and the second diode 14 may be understood with reference to the relationship between the first field effect transistor 1 and the first diode 3.

With reference to FIG. 1, in the present embodiment, the circuit further includes a reverse bias voltage module 4; the reverse bias voltage module 4 is connected between two terminals of the first diode 3 for generating a reverse bias voltage across the first diode 3. Further, the reverse bias voltage module 4 generates a reverse bias voltage between the substrate and the source of the first field effect transistor 1.

A voltage value of the reverse bias voltage may be arbitrarily configured or changed according to requirements. In actual implementation, the value range of the voltage may be 4V to 5V. It can be understood as a commonly-used value range, and the present embodiment does not exclude other value ranges or value implementation manners.

The circuit structure of the reverse bias voltage module 4 mentioned above may be various, and any circuit module that may generate the reverse bias voltage does not deviate from the description of the present embodiment.

Figure 2:
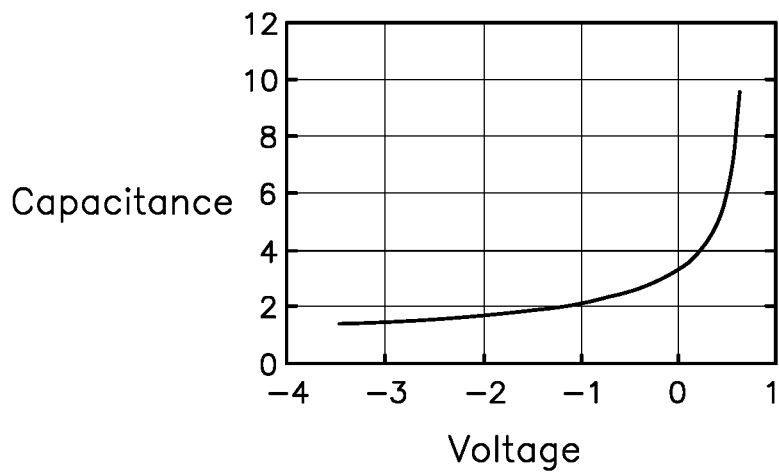
FIG. 2 is a schematic diagram of a voltage-capacitance characteristic of a PN junction under a reverse bias voltage.

FIG. 2 is a schematic diagram of a voltage-capacitance characteristic of a PN junction under a reverse bias voltage.

With reference to FIG. 2, the horizontal axis may represent the value of the voltage of the PN junction, with the unit of volt, which correspondingly may be characterized by V; the vertical axis may represent the capacitance value of the turn-off capacitance of the PN junction, with the unit of picofarads, which correspondingly may be characterized by pF.

The PN junction may be understood as a space charge region formed by an interface when P-type and N-type semiconductors are fabricated on the same semiconductor substrate.

The turn-off capacitance may be understood as a capacitor Coff corresponding to the ground at the COM point (i.e., the second terminal of the first diode) when an FET of the audio path is turned off. As shown in FIG. 2, after the reverse bias voltage is applied to the PN junction, the capacitance value of the PN junction will be significantly reduced, thereby significantly reducing the corresponding capacitance Coff at the COM point.

Therefore, in the present embodiment, a ground capacitance at the COM point when the first field effect transistor is turned off can be effectively reduced, thereby avoiding the reduction of a bandwidth of a digital path due to excessive capacitance. Based on the present invention, it can be seen that the present invention can realize a large size of a first field effect transistor and a high bandwidth of the digital path simultaneously, thereby facilitating the simultaneous improvement of the THD performance of an analog audio path and the bandwidth of the digital path, and avoiding conflicts between the two.

Based on the ideas involved in the present embodiment, relevant personnel may be helped to make products with better performance than products currently on the market.

Figure 3:
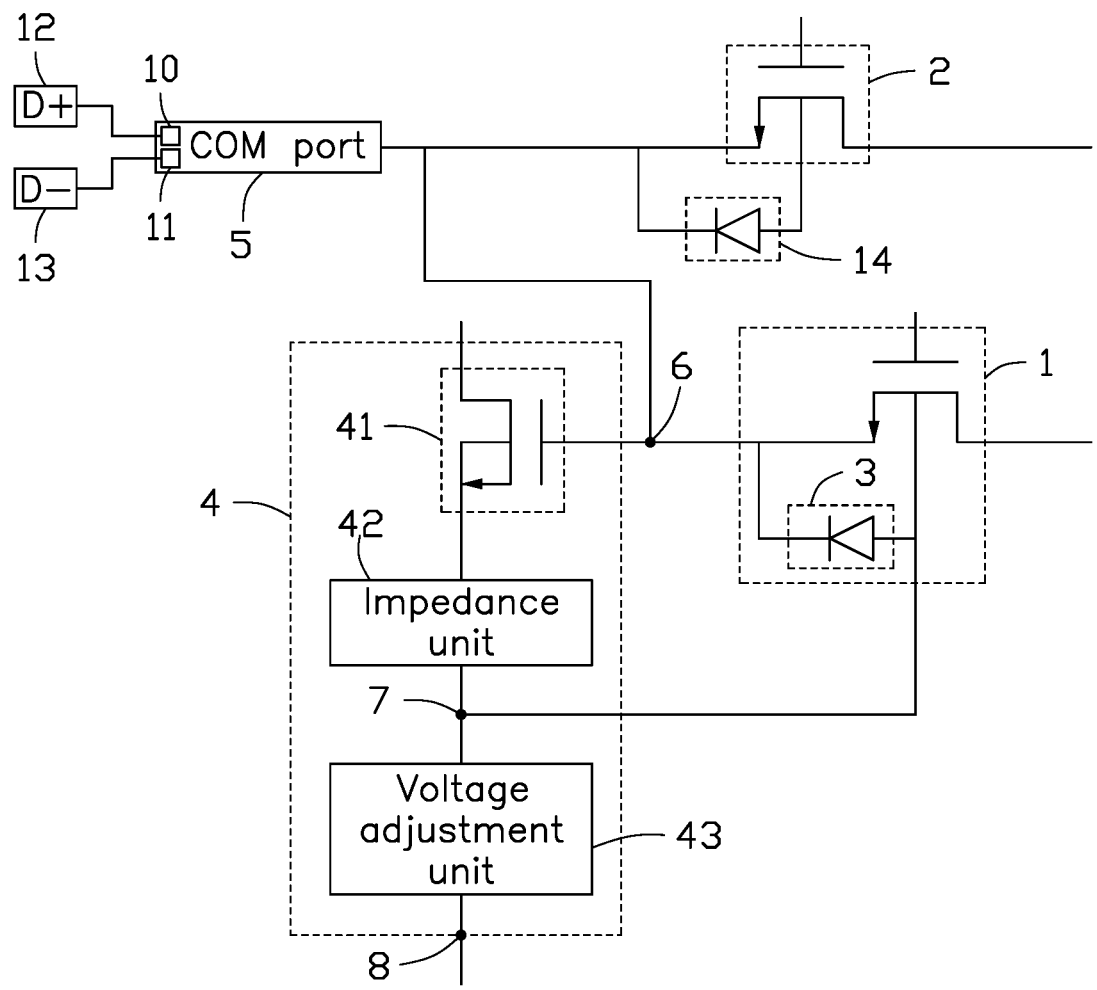
FIG. 3 is a structural schematic diagram 2 of a single-pole double-throw switch circuit with a Type-C interface in an embodiment of the present invention.

FIG. 3 is a structural schematic diagram 2 of a single-pole double-throw switch circuit with a Type-C interface in an embodiment of the present invention.

With reference to FIG. 3, the reverse bias voltage module includes an isolation field effect transistor 41, a voltage adjustment unit 43, and an impedance unit 42 capable of generating a voltage drop when a current flows; a drain of the isolation field effect transistor 41 is connected to other circuits (not shown, which may be other circuits in any chip), and a source of the isolation field effect transistor 41 is connected to one terminal of the impedance unit 42.

A gate of the isolation field effect transistor 41 and a second terminal of the first diode 3 (or a source characterized by the first field effect transistor 1) are commonly connected to a first node 6; the other terminal of the impedance unit 42 and the first terminal of the first diode 3 (or a substrate characterized by the first field effect transistor 1) are commonly connected to a second node 7.

The first node, the second node and the third node mentioned later may be understood that when the circuit is characterized as a circuit diagram, the same circuit position in the actual circuit due to the same potential or different circuit positions connected to each other with the same potential may be characterized as the same node. In the above embodiments, through the description of the nodes, the positions of the connected circuits with the same potential may be uniformly characterized, and the connection relationship and the working principle of the circuits may be more clearly characterized.

It can be also understood that the first node refers to any circuit position that is respectively connected to the gate of the isolation field effect transistor 41 and the second terminal of the first diode 3 (or the source characterized by the first field effect transistor 1) and has the same potential; the first node refers to any circuit position that is respectively connected to the other terminal of the impedance unit 42 and the first terminal of the first diode 3 (or the substrate characterized by the first field effect transistor 1) and has the same potential.

Therefore, the nodes involved in this embodiment and the optional solutions thereof may not only refer to a certain connected pin, terminal, device, etc. The present embodiment also does not exclude the situation where the node is a certain pin, terminal, or device.

When the reverse bias voltage is generated, a potential of the first node 6 is higher than a potential of the second node 7, and a voltage between the first node 6 and the second node 7 is the reverse bias voltage.

The voltage adjustment unit 43 is connected to the second node 7 for adjusting the reverse bias voltage, so that the reverse bias voltage is within a required value range or is within a required value.

Specifically, if a current value of a current flowing through the impedance unit 42 is represented by I, a resistance value of an impedance generated by the impedance unit 42 is represented by R and a voltage value of a voltage between the gate and the source of the isolation field effect transistor 41 may be represented as Vgs, which are normally a fixed value, then the voltage value Vx of the reverse bias voltage generated when the isolation field effect transistor 41 is turned on may be calculated and determined by the following formula: Vx=Vgs+I*R.

Further, in the above embodiment, by selecting impedance units 42 with different resistance values, different reverse bias voltages may be achieved, thereby satisfying various requirements.

In one example, the impedance unit 42 may include a resistor connected in series between the source of the isolation field effect transistor 41 and the second node 7, e.g., including one or more resistors; if more resistors are included, the impedance unit 42 may be determined after more resistors are connected in series and/or in parallel.

In other examples, the impedance unit 42 may also include a Zener diode, and/or other elements that can generate impedance.

In addition to the impedance unit 42 and the isolation field effect transistor 41, the current flowing through the impedance unit 42 may be changed to adjust the reverse bias voltage to further meet various requirements.

Figure 4:
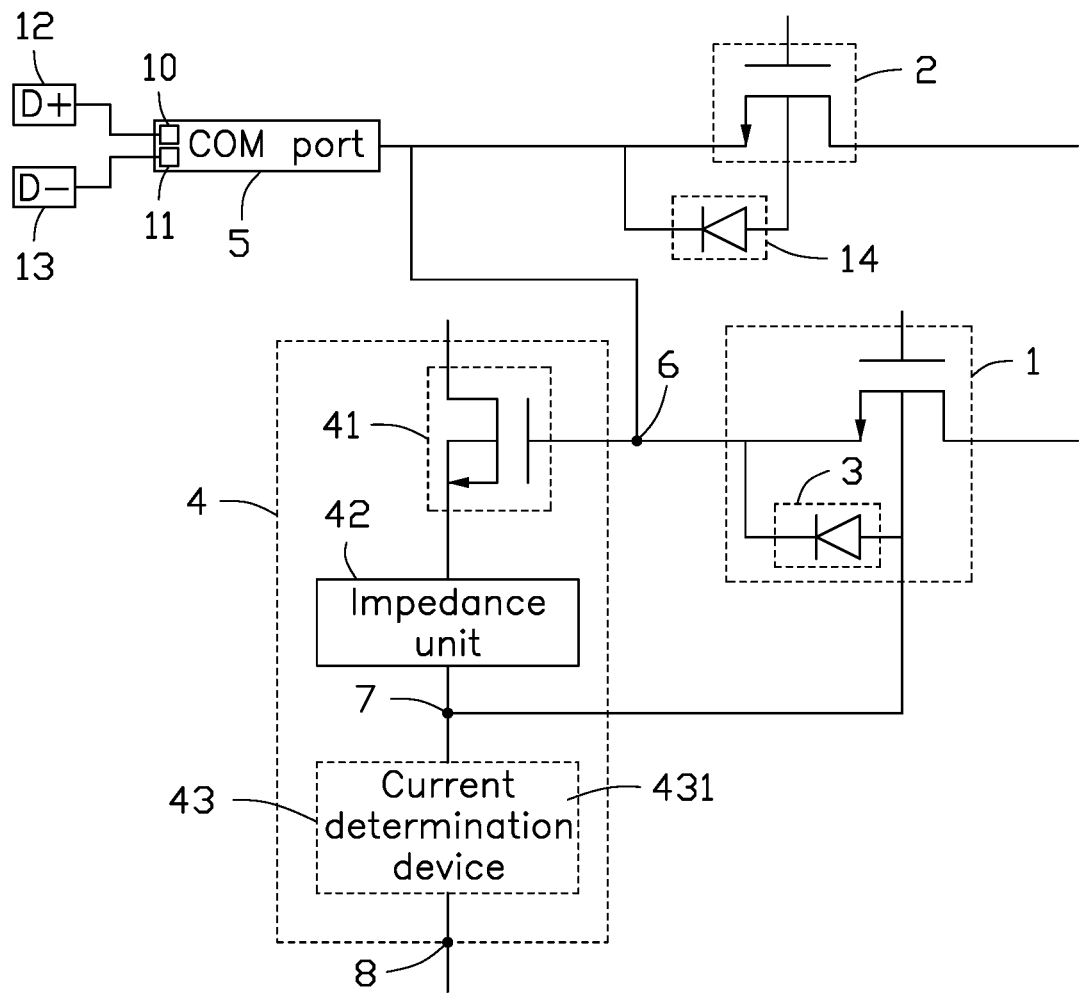
FIG. 4 is a structural schematic diagram 3 of a single-pole double-throw switch circuit with a Type-C interface in an embodiment of the present invention.

FIG. 4 is a structural schematic diagram 3 of a single-pole double-throw switch circuit with a Type-C interface in an embodiment of the present invention.

With reference to FIG. 4, the voltage adjustment unit 43 includes a current determination device 431 connected to the second node 7, wherein the second node 7 is further connected to a third node 8, a potential of the third node 8 is less than a potential of the second node 7, and the current determination device 431 is provided between the second node 7 and the third node 8.

The voltage adjustment unit 431 may be understood as any circuit structure that is configured to determine a current magnitude of the second node 7 so that the reverse bias voltage may be within a required value range or may be within a required value. When the current of the second node 7 changes, the current of the impedance unit 42 may also change accordingly. In a specific implementation, the current of the second node 7 may be the same or similar to the current flowing through the impedance unit 42.

Figure 5:
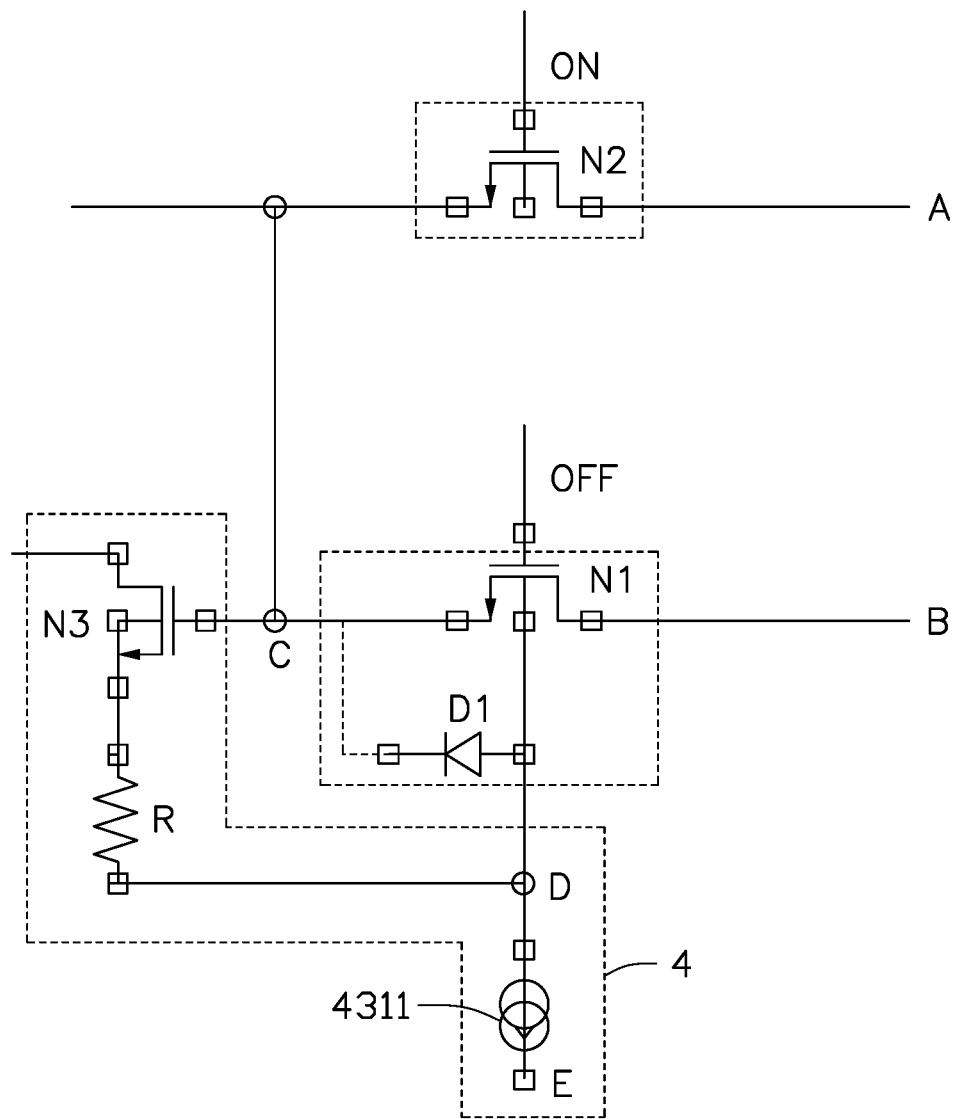
FIG. 5 is a circuit diagram of a single-pole double-throw switch circuit with a Type-C interface in an embodiment of the present invention.

In one example, the current determination device 431 includes a current source connected to the second node 7, which may be a current source 4311 shown in FIG. 5.

By changing the magnitude of the current in the current source, for example, adjusting the current value of the current source, the reverse bias voltage may be easily adjusted to further meet the demand.

In other optional embodiments, in addition to the above-mentioned embodiments, the second node 7 may further be connected to a variable voltage source instead of using the current unit 43. For example, the voltage adjustment unit 43 includes a variable voltage source provided between the second node and the third node; the variable voltage source is configured to determine a voltage between the third node and the second node, so that the reverse bias voltage may be within a required value range or may be within a required value. The variable voltage source may make the voltages of the second node 8 and the first node 6 maintain a fixed voltage difference.

In the above embodiment, through the isolation field effect transistor 41, the COM port may isolate the newly-added current source and related circuits.

FIG. 5 is a circuit diagram of a single-pole double-throw switch circuit with a Type-C interface in an embodiment of the present invention.

With reference to FIG. 5, N1 is used to characterize the first FET, N2 is used to characterize the second FET, N3 is used to characterize the isolation FET, and D1 is used to characterize the first diode; for ease of understanding, FIG. 5 specifically depicts the first diode D1 involved in the foregoing, which is actually the PN junction between the source and the substrate in the first field effect transistor N1. At the same time, an A node, a B node, a C node, a D node and an E node may also be characterized, wherein the C node may be understood as the first node mentioned above, the D node may be understood as the second node mentioned above, and the E node may be understood as the third node mentioned above.

Further, a path between node A and C may be cited as the digital path, and a path between node B and C may be cited as the analog audio path.

The increased reverse bias voltage may significantly reduce the turn-off capacitance corresponding to the node C, thereby facilitating the improvement of the signal bandwidth from COM port 5 to the node A.

And, a size of the first FET 1 may further be increased to improve the THD performance of the analog signal from the COM port to the node B; meanwhile, the reverse bias voltage on the first diode D1 may further be continued to be increased to maintain the turn-off capacitance not to increase or still slightly decrease to ensure that the signal bandwidth from the COM port to the node A is not affected.

In actual implementation, through the implementation of the optional solutions of the present embodiment, the turn-off capacitance may be greatly reduced from about 4 pF to about 1 pF, thereby greatly improving the performance parameters of the switch.

The THD mentioned above may be specifically Total Harmonic Distortion, which may be described as total harmonic distortion, and may, for example, be characterized by a ratio of the root mean square of the various harmonic components of the output signal more than the input signal to the input signal. It can be seen that the THD has a great correlation with audio performance, with an improvement capable of effectively improving the audio performance.

The bandwidth involved above may be characterized as BW, specifically Bandwidth, which may, for example, be characterized by a difference between the highest frequency and the lowest frequency of a signal channel.

The present invention further provides an analog switch chip, including two circuits of the single-pole double-throw switch circuit with a Type-C interface involved in the above optional solutions.

The present invention further provides an electronic device, including the analog switch chip involved in the above optional solutions.

In summary, the present invention provides a single-pole double-throw switch circuit with a Type-C interface, an analog switch chip and an electronic device, which can generate a reverse bias voltage across a first diode, so that a capacitance value of a PN junction can be significantly reduced after the reverse bias voltage is applied to the PN junction. Further, a ground capacitance at a COM point when the first diode is turned off can be effectively reduced, thereby avoiding the reduction of a bandwidth of a digital path due to excessive capacitance. Based on the present invention, it can be seen that the present invention can realize a large size of a first field effect transistor and a high bandwidth of the digital path simultaneously, thereby facilitating the simultaneous improvement of the THD performance of an analog audio path and the bandwidth of the digital path, and avoiding conflicts between the two.

In the last, it should be noted that the above embodiments are only used to illustrate the technical solutions of the present invention, not to limit them; although the present invention has been described in detail with reference to the foregoing embodiments, those of ordinary skill in the art should understand that they can still modify the technical solutions described in the foregoing embodiments, or equivalently replace some or all of the technical features; these modifications or replacements do not cause the essence of the corresponding technical solutions to deviate from the scope of the technical solutions of the embodiments of the present invention.

What is claimed is:

1. A single-pole double-throw switch circuit with a Type-C interface, comprising a digital path and an analog audio path that are configured to be turned on in a time-multiplexed manner and are connected to the same COM port, wherein:
   two pins of the COM port are connected to a D+ pin and a D− pin of the Type-C interface respectively;
   the analog audio path is provided with a first field effect transistor, the analog audio path being through a source of the first field effect transistor and a drain of the first field effect transistor;
   a PN junction between a substrate of the first field effect transistor and the source of the first field effect transistor forms a first diode;
   the substrate of the first field effect transistor is a first terminal of the first diode, and the source of the first field effect transistor is a second terminal of the first diode;
   the single-pole double-throw switch circuit with a Type-C interface further comprises a reverse bias voltage module; and
   the reverse bias voltage module is connected between the first terminal and the second terminal of the first diode for generating a reverse bias voltage across the first diode.

2. The circuit according to claim 1, wherein the reverse bias voltage module comprises an isolation field effect transistor, a voltage adjustment unit, and an impedance unit capable of generating a voltage drop when a current flows;

a source of the isolation field effect transistor is connected to one terminal of the impedance unit;
a gate of the isolation field effect transistor and the second terminal of the first diode are commonly connected to a first node; the other terminal of the impedance unit and the first terminal of the first diode are commonly connected to a second node;
when the reverse bias voltage is generated, a potential of the first node is higher than a potential of the second node, and a voltage between the first node and the second node is the reverse bias voltage; and
the voltage adjustment unit is connected to the second node for adjusting the reverse bias voltage, so that the reverse bias voltage is at a required value or within a required value range.

3. The circuit according to claim 2, wherein the voltage adjustment unit comprises a current determination device connected to the second node; and
the current determination device is configured to determine a current magnitude of the second node, so that the reverse bias voltage is maintained at the required value or within the required value range.

4. The circuit according to claim 3, wherein the current determination device comprises a current source connected to the second node.

5. The circuit according to claim 2, wherein the impedance unit comprises a resistor connected in series between the source of the isolation field effect transistor and the second node.

6. The circuit according to claim 2, wherein the voltage adjustment unit comprises a variable voltage source provided between the second node and a third node, a potential of the third node being lower than the potential of the second node, the variable voltage source is configured to determine a voltage between the third node and the second node, so that the reverse bias voltage is maintained at a required value or be within a required value range.

7. The circuit according to claim 1, wherein the value range of the reverse bias voltage is 4V to 5V.

8. The circuit according to claim 1, wherein the digital path is provided with a second field effect transistor, and the PN junction between the substrate and the source of the second field effect transistor forms a second diode.

9. The circuit according to claim 2, wherein the digital path is provided with a second field effect transistor, and the PN junction between the substrate and the source of the second field effect transistor forms a second diode.

10. The circuit according to claim 3, wherein the digital path is provided with a second field effect transistor, and the PN junction between the substrate and the source of the second field effect transistor forms a second diode.

11. The circuit according to claim 4, wherein the digital path is provided with a second field effect transistor, and the PN junction between the substrate and the source of the second field effect transistor forms a second diode.

12. The circuit according to claim 5, wherein the digital path is provided with a second field effect transistor, and the PN junction between the substrate and the source of the second field effect transistor forms a second diode.

13. The circuit according to claim 6, wherein the digital path is provided with a second field effect transistor, and the PN junction between the substrate and the source of the second field effect transistor forms a second diode.

14. A circuit comprising:
a single-pole double-throw switch circuit with a Type-C interface, the single-pole double-throw switch circuit comprising:
a digital path and an analog path, the digital path and the analog path being connected to a same COM port, the single-pole double-throw switch circuit being configured to time-multiplex the digital path and the analog path, wherein the analog path includes a first field effect transistor, the analog path being through a source of the first field effect transistor and a drain of the first field effect transistor, a PN junction being formed between a substrate of the first field effect transistor and the source of the first field effect transistor; and
a reverse bias voltage circuit connected between the substrate of the first field effect transistor and the source of the first field effect transistor, the reverse bias voltage circuit being configured to generate a reverse bias voltage across the PN junction.

15. The circuit according to claim 14, wherein the reverse bias voltage circuit comprises:
an isolation field effect transistor;
a voltage adjustment unit; and
an impedance unit capable of generating a voltage drop; and wherein:
a source of the isolation field effect transistor is connected to a terminal of the impedance unit;
a gate of the isolation field effect transistor is connected to and the source of the first field effect transistor;
another terminal of the impedance unit is connected to the substrate of the first field effect transistor;
when the reverse bias voltage is generated, a potential of the source of the first field effect transistor is higher than a potential of the substrate of the first field effect transistor, and a voltage between the source and the substrate of the first field effect transistor is the reverse bias voltage; and
the voltage adjustment unit is connected to the substrate of the first field effect transistor for adjusting the reverse bias voltage, so that the reverse bias voltage is at a required value or within a required value range.

16. The circuit according to claim 15, wherein the voltage adjustment unit comprises a current determination device connected to the substrate of the first field effect transistor, wherein the current determination device is configured to determine a current magnitude at the substrate of the first field effect transistor, so that the reverse bias voltage is maintained at the required value or within the required value range.

17. The circuit according to claim 16, wherein the current determination device comprises a current source connected to the substrate of the first field effect transistor.

18. The circuit according to claim 15, wherein the impedance unit comprises a resistor connected in series between the source of the isolation field effect transistor and the substrate of the first field effect transistor.

19. The circuit according to claim 15, wherein the voltage adjustment unit comprises a variable voltage source provided between the substrate of the first field effect transistor and a node, a potential of the node is lower than the potential of the substrate of the first field effect transistor, the variable voltage source is configured to determine a voltage between the node and the substrate of the first field effect transistor, so that the reverse bias voltage is maintained at a required value or within a required value range.

20. The circuit according to claim 14, wherein the digital path includes a second field effect transistor, the digital path being through a source of the second field effect transistor and a drain of the second field effect transistor.

* * * * *